(12) United States Patent
Mandlik et al.

(10) Patent No.: US 12,446,396 B2
(45) Date of Patent: Oct. 14, 2025

(54) ORGANIC LIGHT-EMITTING DIODE DISPLAYS WITH PLANARIZATION LAYERS

(71) Applicant: Apple Inc., Cupertino, CA (US)

(72) Inventors: Prashant Mandlik, Sunnyvale, CA (US); Bhadrinarayana Lalgudi Visweswaran, San Mateo, CA (US); Ankit Mahajan, Los Gatos, CA (US); Chia-Hao Chang, Taoyuan (TW); Christopher E Glazowski, Santa Cruz, CA (US); David L Wei, San Diego, CA (US); Hui Lu, Santa Clara, CA (US); Takahide Ishii, Taoyuan (TW); Themistoklis Afentakis, San Jose, CA (US); Han Liu, Sunnyvale, CA (US); Cheng-Chih Hsieh, Santa Clara, CA (US); Asli Sirman, San Jose, CA (US); Shih Chang Chang, Cupertino, CA (US); Ko-Wei Chen, New Taipei (TW); Shang-Chih Lin, Cupertino, CA (US); Tsung-Ting Tsai, San Jose, CA (US); Jae Won Choi, San Jose, CA (US); Abbas Jamshidi Roudbari, Saratoga, CA (US); Ting-Kuo Chang, San Jose, CA (US); Jean-Pierre S Guillou, San Diego, CA (US)

(73) Assignee: Apple Inc., Cupertino, CA (US)

( * ) Notice: Subject to any disclaimer, the term of this patent is extended or adjusted under 35 U.S.C. 154(b) by 486 days.

(21) Appl. No.: 17/968,280

(22) Filed: Oct. 18, 2022

(65) Prior Publication Data
US 2023/0171988 A1  Jun. 1, 2023

Related U.S. Application Data

(60) Provisional application No. 63/285,020, filed on Dec. 1, 2021.

(51) Int. Cl.
*H10K 50/844* (2023.01)
*H10K 50/80* (2023.01)
(Continued)

(52) U.S. Cl.
CPC .......... *H10K 50/844* (2023.02); *H10K 50/85* (2023.02); *H10K 50/868* (2023.02); *H10K 59/40* (2023.02)

(58) Field of Classification Search
CPC . H10K 59/8731; H10K 50/868; H10K 50/844
See application file for complete search history.

(56) References Cited

U.S. PATENT DOCUMENTS

| 9,716,248 B2 | 7/2017 | Visweswaran et al. |
| 10,026,625 B2 | 7/2018 | Schmid et al. |

(Continued)

FOREIGN PATENT DOCUMENTS

| EP | 3809235 A1 | 4/2021 |
| KR | 20180054386 A | 5/2018 |

*Primary Examiner* — Evren Seven
(74) *Attorney, Agent, or Firm* — Treyz Law Group, P.C.; Joseph F. Guihan (57) ABSTRACT

An electronic device may have a display such as an organic light-emitting diode display. The organic light-emitting diode (OLED) display may have an array of organic light-emitting diode pixels that each have OLED layers interposed between a cathode and an anode. A first passivation layer, a first planarization layer, and a second passivation layer may be formed over the cathode. The first and second passivation layers may be formed from inorganic material. A second planarization layer may be formed over the second passivation layer between the second passivation layer and a polarizer. The second planarization layer may planarize the polarizer at the edges of the active area of the display where the polarizer would otherwise have a steep taper. Planarizing the polarizer in this way mitigates undesirable secondary (Continued)

reflections off of the polarizer. The first and second planarization layers may be formed from organic material.

16 Claims, 7 Drawing Sheets

(51) Int. Cl.
*H10K 50/85* (2023.01)
*H10K 59/40* (2023.01)

(56) References Cited

U.S. PATENT DOCUMENTS

| | | |
|---|---|---|
| 10,431,771 B2 | 10/2019 | Park et al. |
| 11,258,039 B2 * | 2/2022 | Kim .................... H10K 59/131 |
| 12,075,640 B2 * | 8/2024 | Kim .................... H10K 59/123 |
| 2018/0061719 A1 | 3/2018 | Vronsky et al. |
| 2020/0044193 A1 | 2/2020 | Kim et al. |
| 2020/0176710 A1 * | 6/2020 | Kishimoto ............. H10K 59/12 |
| 2021/0119177 A1 | 4/2021 | Bang et al. |
| 2021/0288118 A1 | 9/2021 | Lee et al. |
| 2021/0359252 A1 * | 11/2021 | Wang ................... H10K 50/844 |
| 2021/0367198 A1 * | 11/2021 | Ma ........................ H10K 71/00 |
| 2023/0216013 A1 * | 7/2023 | Cheon ................. H10K 50/844 |
| | | 257/79 |

* cited by examiner

ORGANIC LIGHT-EMITTING DIODE DISPLAYS WITH PLANARIZATION LAYERS

This application claims the benefit of provisional patent application No. 63/285,020, filed Dec. 1, 2021, which is hereby incorporated by reference herein in its entirety.

BACKGROUND

This relates generally to electronic devices, and, more particularly, to electronic devices with displays.

Electronic devices often include displays. For example, an electronic device may have an organic light-emitting diode (OLED) display based on organic light-emitting diode pixels. In this type of display, each pixel includes a light-emitting diode and thin-film transistors for controlling application of a signal to the light-emitting diode to produce light. The light-emitting diodes may include OLED layers positioned between an anode and a cathode.

SUMMARY

An electronic device may have a display such as an organic light-emitting diode display. The organic light-emitting diode (OLED) display may have an array of organic light-emitting diode pixels that each have OLED layers interposed between a cathode and an anode. A first passivation layer, a first planarization layer, and a second passivation layer may be formed over the cathode. The first and second passivation layers may be formed from inorganic material. The first planarization layer may be formed from organic material. A polarizer may be formed over the second passivation layer.

A second planarization layer may be formed over the second passivation layer between the second passivation layer and the polarizer. The second planarization layer may planarize the polarizer at the edges of the active area of the display where the polarizer would otherwise have a steep taper. Planarizing the polarizer in this way mitigates undesirable secondary reflections off of the polarizer. The second planarization layer may be formed from organic material.

The first planarization layer may have a maximum thickness over the active area of the display and a minimum thickness over the inactive area of the display. The first and second passivation layers may be in direct contact in the inactive area of the display. To compensate for the thickness variation of the first planarization layer, the second planarization layer may have a maximum thickness over the inactive area of the display and a minimum thickness over the active area of the display.

DETAILED DESCRIPTION

Figure 1:
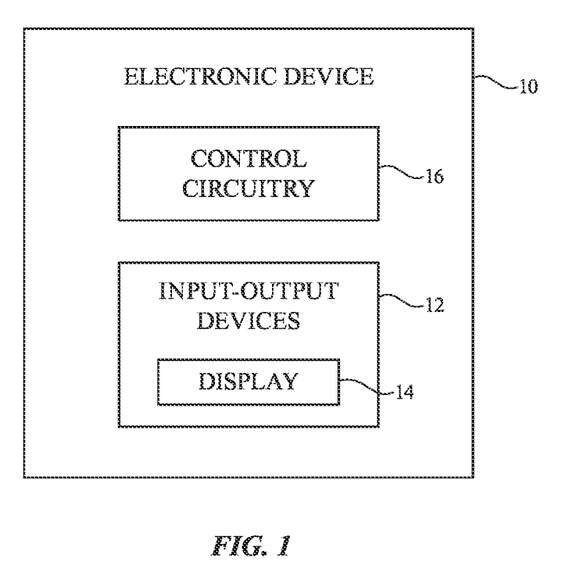
FIG. 1 is a schematic diagram of an illustrative electronic device having a display in accordance with an embodiment.

An illustrative electronic device of the type that may be provided with a display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a display, a computer display that contains an embedded computer, a computer display that does not contain an embedded computer, a gaming device, a navigation device, an embedded system such as a system in which electronic equipment with a display is mounted in a kiosk or automobile, or other electronic equipment. Electronic device 10 may have the shape of a pair of eyeglasses (e.g., supporting frames), may form a housing having a helmet shape, or may have other configurations to help in mounting and securing the components of one or more displays on the head or near the eye of a user.

As shown in FIG. 1, electronic device 10 may include control circuitry 16 for supporting the operation of device 10. The control circuitry may include storage such as hard disk drive storage, nonvolatile memory (e.g., flash memory or other electrically-programmable-read-only memory configured to form a solid state drive), volatile memory (e.g., static or dynamic random-access memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a liquid crystal display, an organic light-emitting diode display, or any other desired type of display. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements. A touch sensor for display 14 may be formed from electrodes formed on a common display substrate with the pixels of display 14 or may be formed from a separate touch sensor panel that overlaps the pixels of display 14. If desired, display 14 may be insensitive to touch (i.e., the touch sensor may be omitted). Display 14 in electronic device 10 may be a head-up display that can be viewed without requiring users to look away from a typical viewpoint or may be a head-mounted display that is incorporated into a device that is worn on a user's head. If desired, display 14 may also be a holographic display used to display holograms.

Control circuitry 16 may be used to run software on device 10 such as operating system code and applications. During operation of device 10, the software running on control circuitry 16 may display images on display 14.

Figure 2:
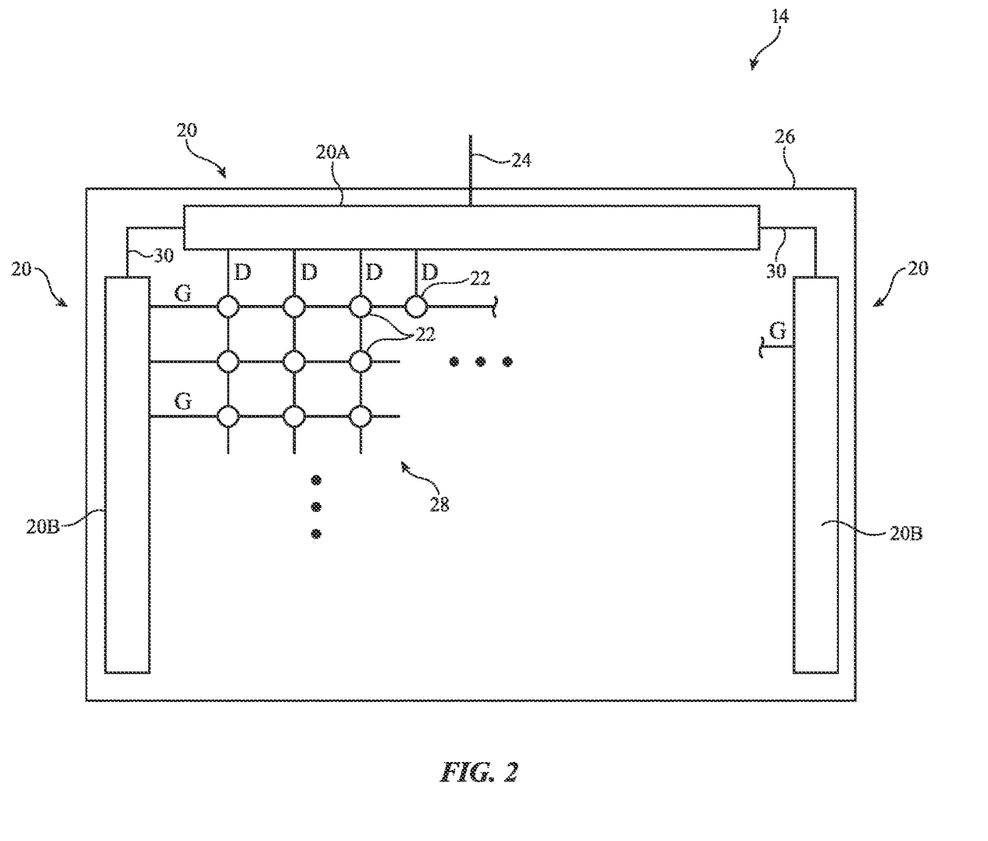
FIG. 2 is a schematic diagram of an illustrative display in accordance with an embodiment.

FIG. 2 is a diagram of an illustrative display. As shown in FIG. 2, display 14 may include layers such as substrate layer 26. Substrate layers such as layer 26 may be formed from rectangular planar layers of material or layers of material with other shapes (e.g., circular shapes or other shapes with one or more curved and/or straight edges). The substrate layers of display 14 may include glass layers, polymer layers, silicon layers, composite films that include polymer and inorganic materials, metallic foils, etc.

Display 14 may have an array of pixels 22 for displaying images for a user such as pixel array 28. Pixels 22 in array 28 may be arranged in rows and columns. The edges of array 28 may be straight or curved (i.e., each row of pixels 22 and/or each column of pixels 22 in array 28 may have the same length or may have a different length). There may be any suitable number of rows and columns in array 28 (e.g., ten or more, one hundred or more, or one thousand or more, etc.). Display 14 may include pixels 22 of different colors. As an example, display 14 may include red pixels, green pixels, and blue pixels.

Display driver circuitry 20 may be used to control the operation of pixels 28. Display driver circuitry 20 may be formed from integrated circuits, thin-film transistor circuits, and/or other suitable circuitry. Illustrative display driver circuitry 20 of FIG. 2 includes display driver circuitry 20A and additional display driver circuitry such as gate driver circuitry 20B. Gate driver circuitry 20B may be formed along one or more edges of display 14. For example, gate driver circuitry 20B may be arranged along the left and right sides of display 14 as shown in FIG. 2.

As shown in FIG. 2, display driver circuitry 20A (e.g., one or more display driver integrated circuits, thin-film transistor circuitry, etc.) may contain communications circuitry for communicating with system control circuitry over signal path 24. Path 24 may be formed from traces on a flexible printed circuit or other cable. The control circuitry may be located on one or more printed circuits in electronic device 10. During operation, control circuitry (e.g., control circuitry 16 of FIG. 1) may supply circuitry such as a display driver integrated circuit in circuitry 20 with image data for images to be displayed on display 14. Display driver circuitry 20A of FIG. 2 is located at the top of display 14. This is merely illustrative. Display driver circuitry 20A may be located at both the top and bottom of display 14 or in other portions of device 10.

To display the images on pixels 22, display driver circuitry 20A may supply corresponding image data to data lines D while issuing control signals to supporting display driver circuitry such as gate driver circuitry 20B over signal paths 30. With the illustrative arrangement of FIG. 2, data lines D run vertically through display 14 and are associated with respective columns of pixels 22.

Gate driver circuitry 20B (sometimes referred to as gate line driver circuitry or horizontal control signal circuitry) may be implemented using one or more integrated circuits and/or may be implemented using thin-film transistor circuitry on substrate 26. Horizontal control lines G (sometimes referred to as gate lines, scan lines, emission control lines, etc.) run horizontally through display 14. Each gate line G is associated with a respective row of pixels 22. If desired, there may be multiple horizontal control lines such as gate lines G associated with each row of pixels. Individually controlled and/or global signal paths in display 14 may also be used to distribute other signals (e.g., power supply signals, etc.).

Gate driver circuitry 20B may assert control signals on the gate lines G in display 14. For example, gate driver circuitry 20B may receive clock signals and other control signals from circuitry 20A on paths 30 and may, in response to the received signals, assert a gate line signal on gate lines G in sequence, starting with the gate line signal G in the first row of pixels 22 in array 28. As each gate line is asserted, data from data lines D may be loaded into a corresponding row of pixels. In this way, control circuitry such as display driver circuitry 20A and 20B may provide pixels 22 with signals that direct pixels 22 to display a desired image on display 14. Each pixel 22 may have a light-emitting diode and circuitry (e.g., thin-film circuitry on substrate 26) that responds to the control and data signals from display driver circuitry 20.

Gate driver circuitry 20B may include blocks of gate driver circuitry such as gate driver row blocks. Each gate driver row block may include circuitry such output buffers and other output driver circuitry, register circuits (e.g., registers that can be chained together to form a shift register), and signal lines, power lines, and other interconnects. Each gate driver row block may supply one or more gate signals to one or more respective gate lines in a corresponding row of the pixels of the array of pixels in the active area of display 14.

Figure 3:
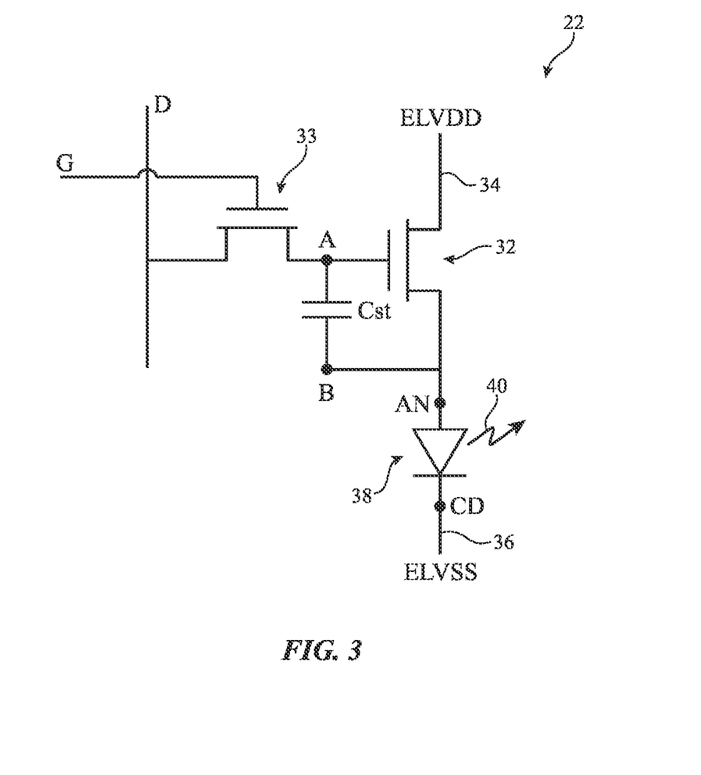
FIG. 3 is a diagram of an illustrative pixel circuit in accordance with an embodiment.

A schematic diagram of an illustrative pixel circuit of the type that may be used for each pixel 22 in array 28 is shown in FIG. 3. As shown in FIG. 3, display pixel 22 may include light-emitting diode 38. A positive power supply voltage ELVDD may be supplied to positive power supply terminal 34 and a ground power supply voltage ELVSS may be supplied to ground power supply terminal 36. Diode 38 has an anode (terminal AN) and a cathode (terminal CD). The state of drive transistor 32 controls the amount of current flowing through diode 38 and therefore the amount of emitted light 40 from display pixel 22. Cathode CD of diode 38 is coupled to ground terminal 36, so cathode terminal CD of diode 38 may sometimes be referred to as the ground terminal for diode 38.

To ensure that transistor 38 is held in a desired state between successive frames of data, display pixel 22 may include a storage capacitor such as storage capacitor Cst. The voltage on storage capacitor Cst is applied to the gate of transistor 32 at node A to control transistor 32. Data can be loaded into storage capacitor Cst using one or more switching transistors such as switching transistor 33. When switching transistor 33 is off, data line D is isolated from storage capacitor Cst and the gate voltage on terminal A is equal to the data value stored in storage capacitor Cst (i.e., the data value from the previous frame of display data being displayed on display 14). When gate line G (sometimes referred to as a scan line) in the row associated with display pixel 22 is asserted, switching transistor 33 will be turned on and a new data signal on data line D will be loaded into storage capacitor Cst. The new signal on capacitor Cst is applied to the gate of transistor 32 at node A, thereby adjusting the state of transistor 32 and adjusting the corresponding amount of light 40 that is emitted by light-emitting diode 38. If desired, the circuitry for controlling the operation of light-emitting diodes for display pixels in display 14 (e.g., transistors, capacitors, etc. in display pixel circuits such as the display pixel circuit of FIG. 3) may be formed using other configurations (e.g., configurations that include circuitry for compensating for threshold voltage variations in drive transistor 32, etc.). The display pixel circuit of FIG. 3 is merely illustrative.

Figure 4:
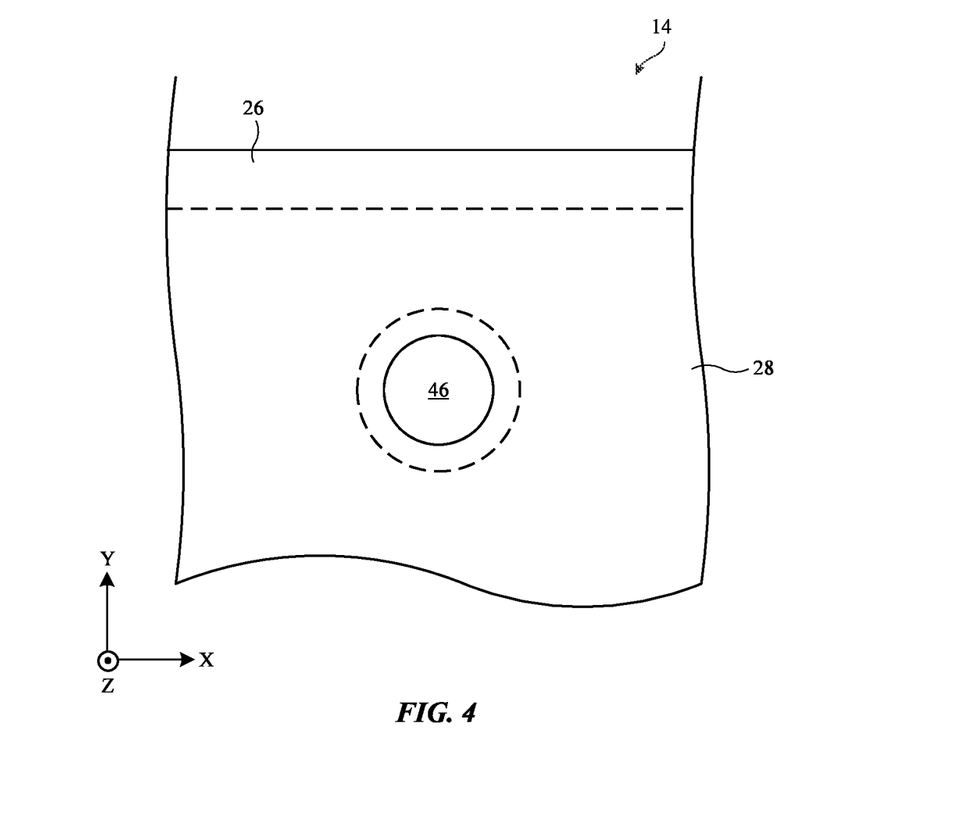
FIG. 4 is a top view of an illustrative display with a first inactive area at a peripheral edge and a second inactive area in a central portion of the active area in accordance with an embodiment.

FIG. 4 is a top view of display 14. As shown in FIG. 4, display 14 may have an active area (sometimes referred to as light-emitting area) formed by pixel array 28 on substrate 26. Edges of the active area are defined by the dashed lines in FIG. 4. Edges of the substrate are defined by the solid lines in FIG. 4. Display 14 also includes inactive areas (sometimes referred to as non-light-emitting areas). The inactive areas may include non-light-emitting components on substrate 26, a hole in substrate 26, etc. The display may include an inactive area along the peripheral (outermost) edges of the display (e.g., left, right, upper, and lower edges of a substantially rectangular display). In some cases, the active area may have an opening in a central portion of the display. As shown in the example of FIG. 4, inactive area 46 (sometimes referred to as active area opening 46, display opening 46, inactive area island 46, etc.) is formed within active area 28 and is completely laterally surrounded by active area 28. Inactive area 46 may be, for example, a physical hole in the display (including substrate 26) that allows for input-output components (such as a camera or other optical sensor) to operate through the display (through the physical hole).

Figure 5:
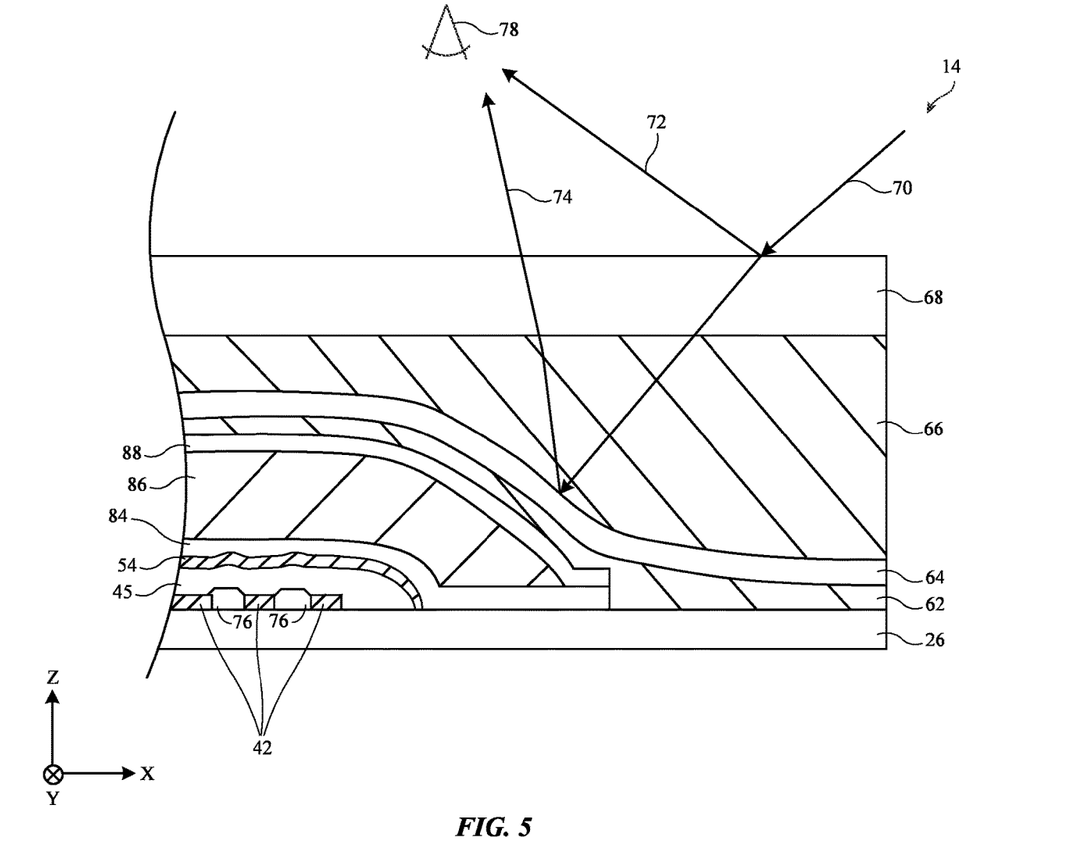
FIG. 5 is a cross-sectional side view of an illustrative display with a tapered polarizer over a first passivation layer, a planarization layer, and a second passivation layer in accordance with an embodiment.

If care is not taken, a polarizer in display 14 may cause undesired reflections due to non-planarity at the edges of the active area. FIG. 5 is a cross-sectional side view of a display with a non-planar polarizer at the edges of the display. As shown, display 14 may include electrodes (anodes) 42 on substrate 26. Each anode 42 serves as the anode (AN) for a respective pixel 22. Display 14 may also include a pixel definition layer (PDL) 76. The pixel definition layer may be formed from a dielectric material and may be interposed between adjacent anodes of the display. The pixel definition layer may have openings in which the anodes are formed, thereby defining the light-emitting area of each pixel. In some cases, the pixel definition layer may be shaped in a way that reduces leakage between adjacent pixels. Pixel definition layer 76 may include one or more layers and can either be opaque or transparent. The pixel definition layer may be formed from one or more materials (e.g., silicon nitride, silicon dioxide, etc.). The pixel definitional layer may also be formed from an organic material if desired. The shape of the pixel definitional layer may create discontinuities in the overlying organic light-emitting diode display layers if desired.

Organic light-emitting diode layers 45 are formed over anodes 42 and pixel definition layer 76. The organic light-emitting diode layers may include a hole injection layer, a hole transport layer, an emissive layer, an electron transport layer, and an electronic injection layer (as one possible arrangement). The OLED layers 45 are covered by a common electrode layer 54 that may serve as the cathode (CD) for pixel array 28. In another illustrative arrangement, the organic light-emitting diode may be inverted such that the cathode is patterned per-pixel and the anode is a common layer. If desired, the OLED layers may form a tandem diode and OLED layers 45 may include an electron blocking layer, a charge generation layer, a hole blocking layer, etc.

A first passivation layer 84 (sometimes referred to as dielectric layer 84) is formed over cathode 54. Passivation layer 84 may form a moisture blocking layer that prevents moisture from penetrating to reach OLED layers 45. Passivation layer 84 may be formed from, for example, an inorganic material.

The surface topology of the OLED stack and processing restraints (to prevent damaging the OLED stack) may result in passivation layer 84 not forming a total moisture seal for OLED layers 45. Accordingly, a planarization layer 86 (sometimes referred to as dielectric layer 86) may be formed over passivation layer 84. Planarization layer 86 may be formed from an organic material (e.g., that is deposited using inkjet printing). The planarization layer 86 may planarize the surface topology of the OLED layers, resulting in a planar upper surface for the planarization layer 86 (over the active area).

An additional passivation layer 88 (sometimes referred to as dielectric layer 88) is then formed over the planarization layer 86. The additional passivation layer 88 may form a final moisture-block that prevents any moisture from penetrating to reach OLED layers 45. Passivation layer 88 may be formed from, for example, an inorganic material. Passivation layers 84 and 88 are separated from each other by planarization layer 86 in the active area of the display but may be in direct contact in the inactive area of the display.

Anodes 42 (and corresponding OLED layers and cathode 54) form pixels 22 for the active (light-emitting) area of display 14. A polarizer such as polarizer 64 in FIG. 5 may be formed over display 14. Polarizer 64 may include a linear polarizer. Polarizer 64 may optionally include a quarter wave plate such that polarizer 64 is a circular polarizer. Polarizer 64 may be attached to the display with adhesive layer 62. Adhesive layer 62 conforms to the topology of passivation layer 88 and substrate 26. In a central portion of the active area of the display, adhesive layer 62 may be planar (because underlying passivation layer 88 is planar). However, adhesive layer 62 is sloped (tapered) at the edge of the active area as shown in FIG. 5 (because the underlying passivation layer 88 and planarization layer 86 are sloped at the edge of the active area). Polarizer 64 conforms to adhesive layer 62. Consequently, polarizer 64 may be substantially planar over the central portions of the active area of the display but may be tapered at the edges of the active area of the display (as shown in FIG. 5).

An additional adhesive layer 66 is formed over polarizer 64 and conforms to polarizer 64. Adhesive layer 66 has a planar upper surface. A transparent cover layer 68 is formed on adhesive layer 66 (and attached to polarizer 64 using adhesive 66). The transparent cover layer 68 may form an outermost layer of the display (e.g., light is emitted by the display in the positive Z-direction through the transparent cover layer). The transparent cover layer may be formed from plastic, glass, or another desired transparent material.

In the display of FIG. 5, polarizer 64 is tapered at the edges of the display. This may be true at both the interface between the active area and inactive area hole 46 in FIG. 4 and at the outermost edges of the active area (e.g., a left edge, a right edge, an upper edge, a lower edge). At each transition between light-emitting area and non-light-emitting area, planarization layer 86 and polarizer 64 are tapered. Ambient light may undesirably reflect off the tapered portion of polarizer 64 towards a viewer of the display. See, for example, ambient light ray 70. Some of the ambient light is reflected off the outer surface of cover layer 68 towards viewer 78. Some of the light is transmitted through cover layer 68 and reflects off the tapered portion of polarizer 64. This reflected light 74 passes back through cover layer 68 towards viewer 78. In other words, due to the slope of polarizer 64, viewer 78 ends up seeing a secondary reflection (off polarizer 64) in addition to the primary reflection (off cover layer 68). This secondary reflection may be aesthetically displeasing to the viewer, particularly when the display is turned off.

Figure 6:
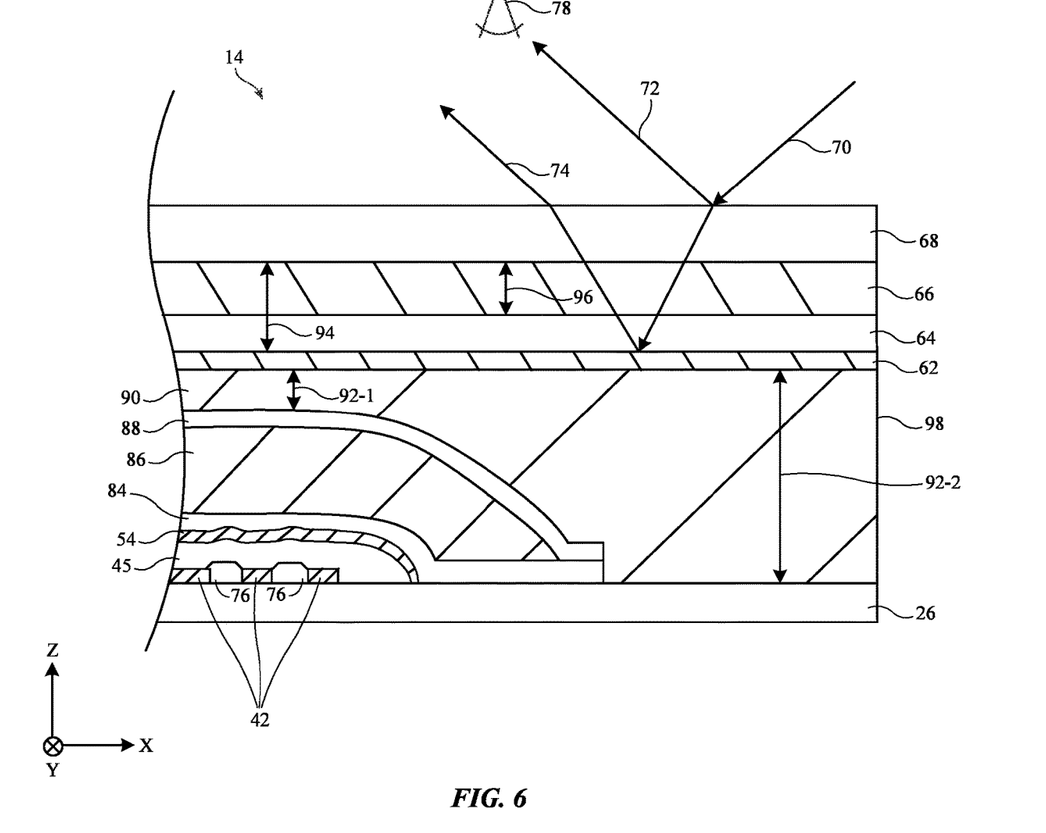
FIG. 6 is a cross-sectional side view of an illustrative display with a planarized polarizer over a first passivation layer, a first planarization layer, a second passivation layer, and a second planarization layer in accordance with an embodiment.

To mitigate secondary reflections off of the tapered portion of polarizer 64, an additional planarization layer may be included in the display. FIG. 6 is a cross-sectional side view of an illustrative display with an additional planarization layer. Most of the components in the display of FIG. 6 are the same as in the display of FIG. 5 and will not be described again in connection with FIG. 6. In addition to passivation layer 84, planarization layer 86, and passivation layer 88, display 14 in FIG. 6 includes an additional planarization layer 90 (sometimes referred to as dielectric layer 90). Planarization layer 90 may be formed over and conforms to passivation layer 88 and substrate 26. Planarization layer 90 may be formed from an organic material. The planarization layer 90 may planarize the taper of underlying passivation layer 88, resulting in a more planar surface for the deposition of adhesive 62 and polarizer 64.

The polarizer in FIG. 6 is therefore more planar than the polarizer in FIG. 5. Accordingly, as shown in FIG. 6, secondary reflections 74 are not directed to the same location as primary reflections 72. Therefore, viewer 78 cannot detect the secondary reflections 74 when viewing the display (even when the display is turned off).

Passivation layers 84 and 88 may have relatively uniform thicknesses (e.g., thicknesses that vary by less than 40%, less than 20%, less than 10%, less than 5%, less than 3%, less than 1%, etc.). Planarization layer 86 has a varying thickness, with a maximum thickness in a portion over the active area and a minimum thickness in a portion over the inactive area. To planarize the surface on which polarizer 64 is formed, planarization layer 90 may have a varying thickness (e.g., that compensates for the varying thickness of planarization layer 86). As shown in FIG. 6, in a first portion of the planarization layer 90 (e.g., over the active area of the display), the planarization layer has a first thickness 92-1. In a second portion of the planarization layer 90 (e.g., over the inactive area of the display), the planarization layer has a second thickness 92-2. Thickness 92-2 is greater than thickness 92-1 to compensate for the drop in thickness of the other display components between the active area to the inactive area. The maximum thickness of planarization layer 90 may be greater than the minimum thickness of planarization layer 90 by at least 20%, at least 50%, at least 100%, at least 150%, at least 200%, at least 300%, etc. For example, thickness 92-1 over the active area may be the minimum thickness of the planarization layer and may be between 5 microns and 15 microns (e.g., 10 microns). Thickness 92-2 over the inactive area may be the maximum thickness of the planarization layer and may be between 20 microns and 30 microns (e.g., 25 microns).

Another way to characterize the planarizing functionality of layer 90 is through the taper of the upper surface of the layer. The upper surface of layer 90 may be totally planar (e.g., parallel to the XY-plane). Alternatively, the upper surface of layer 90 may have a small taper that is of a sufficiently low magnitude to mitigate the undesirable secondary reflections shown in connection with FIG. 5. The maximum slope of the upper surface of planarization layer 90 may be less than 10 microns (of drop in the Z-direction) per 1 millimeter (of lateral extension in the X-direction or Y-direction), 5 microns (of drop in the Z-direction) per 1 millimeter (of lateral extension in the X-direction or Y-direction), 3 microns (of drop in the Z-direction) per 1 millimeter (of lateral extension in the X-direction or Y-direction), 2 microns (of drop in the Z-direction) per 1 millimeter (of lateral extension in the X-direction or Y-direction), 1 micron (of drop in the Z-direction) per 1 millimeter (of lateral extension in the X-direction or Y-direction), etc.

Another way to characterize the planarizing functionality of layer 90 is through the distance 94 between the upper surface of planarization layer 90 and the lower surface of cover layer 68. Distance 94 may vary (e.g., the difference between the maximum magnitude and minimum magnitude) by less than 1 micron, less than 3 microns, less than 5 microns, less than 8 microns, less than 10 microns, etc. The maximum magnitude of distance 94 may differ from the minimum magnitude of distance 94 by less than 100%, less than 50%, less than 30%, less than 20%, less than 10%, less than 5%, less than 3%, less than 1%, etc.

Another way to characterize the planarizing functionality of layer 90 is through the distance 96 between the upper surface of polarizer 64 and the lower surface of cover layer 68. Distance 96 may vary (e.g., the difference between the maximum magnitude and minimum magnitude) by less than 1 micron, less than 3 microns, less than 5 microns, less than 8 microns, less than 10 microns, etc. The maximum magnitude of distance 96 may differ from the minimum magnitude of distance 96 by less than 100%, less than 50%, less than 30%, less than 20%, less than 10%, less than 5%, less than 3%, less than 1%, etc.

It should be noted that passivation layer 88 directly contacts passivation layer 84 to ensure a sufficient moisture barrier to protect OLED layers 45. This direct contact causes planarization layer 86 to have its thickness drop to 0 in the inactive area of the display, which necessitates an aggressive taper. The upper surface of planarization layer 86 may therefore have a maximum slope of more than 10 microns (of drop in the Z-direction) per 1 millimeter (of lateral extension in the X-direction or Y-direction), more than 30 microns (of drop in the Z-direction) per 1 millimeter (of lateral extension in the X-direction or Y-direction), more than 100 microns (of drop in the Z-direction) per 1 millimeter (of lateral extension in the X-direction or Y-direction), more than 500 microns (of drop in the Z-direction) per 1 millimeter (of lateral extension in the X-direction or Y-direction), etc.

As shown in FIG. 6, planarization layer 90 may be cut during manufacturing to form a vertical sidewall 98. Vertical sidewall 98 may be exposed to the interior of the electronic device, for example. Vertical sidewall 98 may be substantially orthogonal (e.g., within 5 degrees of orthogonal, within 3 degrees of orthogonal, within 1 degree of orthogonal, etc.) to a planar upper surface of cover layer 68, a planar lower surface of cover layer 68, and/or a planar upper surface of substrate 26.

It is reiterated that the technique of FIG. 6 where an additional planarization layer is included in the display to cause a more planar polarizer and mitigate visible secondary reflections off the polarizer may be applied to the interface between the active area and inactive area hole 46 in FIG. 4 and at the outermost edges of the active area (e.g., a left edge, a right edge, an upper edge, a lower edge). In general, this technique may be used at any edge of the active area, regardless of its position. The additional planarization layer 90 may have a footprint that overlaps the active area of the display and includes portions in the inactive area of the display to ensure a planar polarizer across the display.

In some cases (e.g., at the edge of an active area opening 46 as in FIG. 4), display layers such as organic light-emitting diode layers 45 cannot easily be removed during the manufacturing process. In other words, to mitigate the cost and complexity of manufacturing, the organic light-emitting diode layers 45 may be deposited as a blanket layer across the entire display, including within active area opening 46. If care is not taken, this may cause leakage current from pixels within the active area of the display to cause emission from the inactive area of the display.

Figure 7:
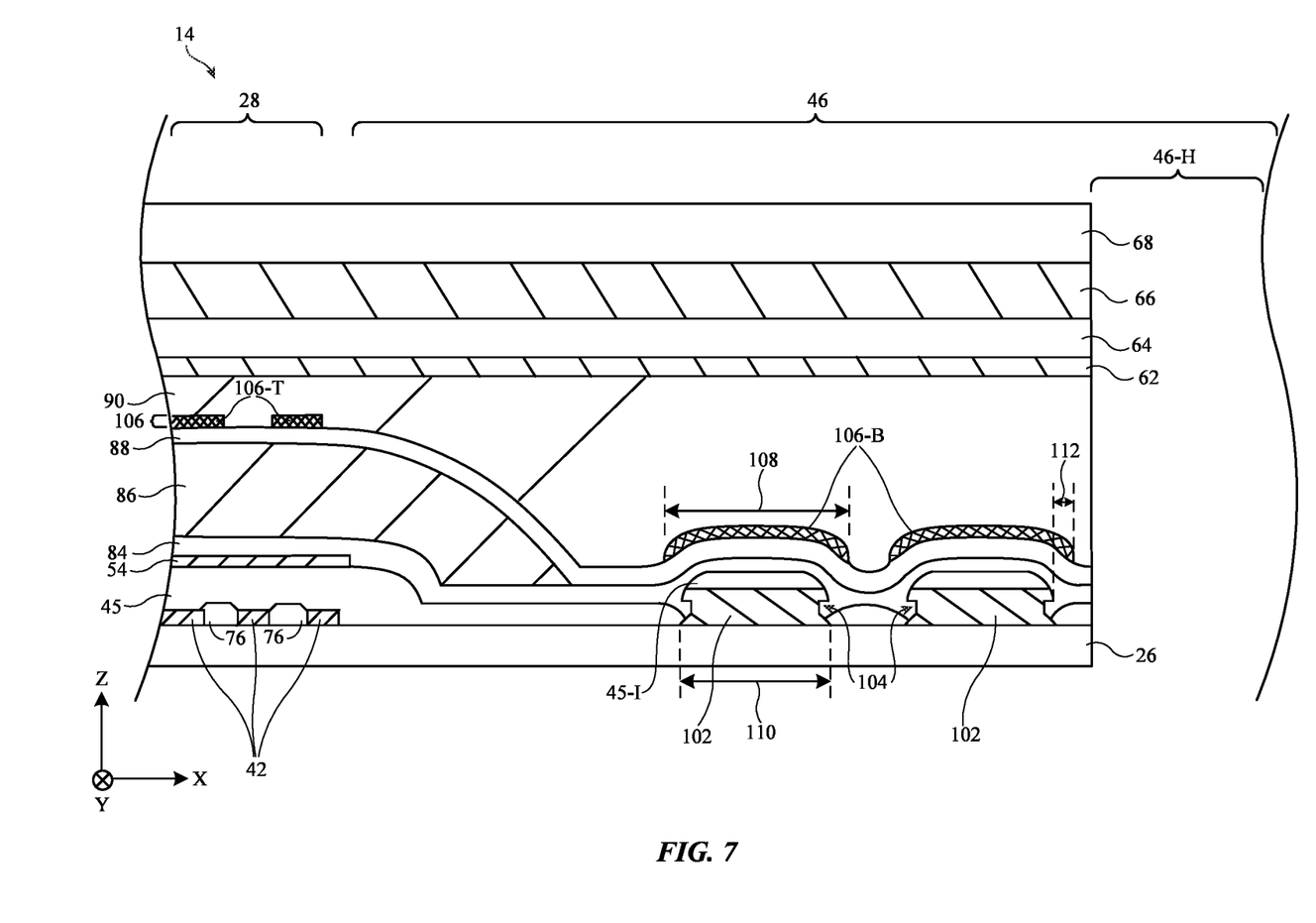
FIG. 7 is a cross-sectional side view of an illustrative display with a cutting structure overlapped by a metal layer portion in accordance with an embodiment.

To mitigate this issue, one or more cutting structures may be incorporated adjacent to the edge of the pixel array 28 (e.g., the edge of the active area). FIG. 7 is a cross-sectional side view of an illustrative display with an active area opening 46 (inactive area island) that includes a physical hole 46-H through the display. Substrate 26 has an inactive area between the active area (e.g., pixel array 28) and the edge of the physical hole. Within this inactive area on substrate 26, one or more cutting structures 102 are formed. The cutting structures may have one or more layers (e.g., 2 layers or 3 layers) that define undercuts 104. In other words, the upper layer of the cutting structure has edges that extend past the edges of an underlying layer of the cutting structure to create an undercut. This type of structure creates discontinuities in OLED layers 45 when the OLED layers are deposited across the display. As shown in FIG. 7, OLED layers 45 have isolated portions 45-I that are electrically separated from the remaining portions of OLED layers 45 by cutting structures 45-I. In other words, cutting structures 102 create discontinuities between different portions of OLED layers 45.

Passivation layers 84 and 88 also overlap cutting structures 102 and OLED layers 45 within the inactive area island 46. Ideally, the passivation layers have a sufficient thickness to maintain continuity when overlapping the cutting structures 102. Upon initial deposition, passivation layers 84 and 88 may maintain continuity over the cutting structures. However, the cutting structures may create seams in the passivation layers that, over time, may be penetrated by moisture and expand to eventually create openings that undesirably expose the underlying OLED layers to moisture.

To mitigate moisture penetration through seams in passivation layers 84 and 88, a metal layer 106 may be formed over the cutting structures. Within the pixel array 28 (e.g., the display active area), metal layer 106 may have portions 106-T that form touch-sensing electrodes for electronic device 10. In other words, portions 106-T are touch-sensor metal for a touch-sensitive layer. In the inactive area of the display over cutting structures 102, metal layer 106 may include portions 106-B to block moisture from penetrating seams in passivation 84 and 88.

Each portion 106-B may have a width 108 that is greater than the width 110 of the underlying cutting structure 102 (e.g., by at least 5%, by at least 10%, by at least 20%, by at least 50%, by at least 100%, etc.). This ensures that seams in the passivation layers are adequately covered by metal layer portions 106-B. Width 108 may be greater than the width 110 by at least 2 microns, at least 5 microns, at least 10 microns, at least 20 microns, etc.

The edge of each portion 106-B may extend past the edge of its underlying cutting structure by distance 112. Distance 112 may be at least 1 microns, at least 2 microns, at least 3 microns, at least 5 microns, at least 10 microns, etc. Distance 112 may be the same on either side of the cutting structure or may be different on either side of the cutting structure.

In FIG. 7, metal layer portions 106-B (for moisture blocking) are formed from the same material (and during the same manufacturing step) as metal layer portions 106-T (for touch-sensing). This example is merely illustrative. If desired, metal layer portions 106-B may be formed from a different material (and during a different manufacturing step) than the touch-sensor metal 106-T. Metal layer 106 may comprise one or more of tungsten (and/or an oxide or nitride including tungsten), molybdenum (and/or an oxide or nitride including molybdenum), titanium (and/or an oxide or nitride including titanium), tantalum (and/or an oxide or nitride including tantalum), aluminum (and/or an oxide or nitride including aluminum), etc.

In yet another possible arrangement, portion 106-B may be formed from a dielectric material that sufficiently blocks penetration of moisture.

The foregoing is merely illustrative and various modifications can be made by those skilled in the art without departing from the scope and spirit of the described embodiments. The foregoing embodiments may be implemented individually or in any combination.

What is claimed is:

1. An electronic device with a display, the electronic device comprising:
 a substrate;
 an array of display pixels arranged on the substrate in a light-emitting area of the display;
 a first passivation layer that is formed over the array of display pixels;
 a first planarization layer that is formed over the first passivation layer;
 a second passivation layer that is formed over the first planarization layer;
 a second planarization layer that is formed over the second passivation layer; and
 a polarizer that is formed over the second planarization layer, wherein the second planarization layer has a first portion that overlaps the light-emitting area and a second portion that overlaps a non-light-emitting area of the display, wherein the first portion of the second planarization layer has a first thickness, wherein the second portion of the second planarization layer has a second thickness that is greater than the first thickness, and wherein the second thickness is greater than the first thickness by at least 100%.

2. The electronic device defined in claim 1, further comprising:
 a first layer of adhesive that is interposed between the second planarization layer and the polarizer.

3. The electronic device defined in claim 2, further comprising:
 a transparent cover layer that is formed over the polarizer; and
 a second layer of adhesive that is interposed between the polarizer and the transparent cover layer.

4. The electronic device defined in claim 1, wherein the first planarization layer is interposed between the first and second passivation layers over the light-emitting area.

5. The electronic device defined in claim 4, wherein the first and second passivation layers are in direct contact in the non-light-emitting area of the display.

6. The electronic device defined in claim 5, wherein the display has a peripheral edge and the non-light-emitting area is formed along the peripheral edge.

7. The electronic device defined in claim 5, wherein the non-light-emitting area is laterally surrounded by the light-emitting area.

8. The electronic device defined in claim 1, wherein the first and second planarization layers are formed from organic material and wherein the first and second passivation layers are formed from inorganic material.

9. The electronic device defined in claim 1, wherein the first planarization layer has a first portion that overlaps the light-emitting area and a second portion that overlaps the non-light-emitting area, wherein the first portion of the first planarization layer has a third thickness, and wherein the second portion of the first planarization layer has a fourth thickness that is less than the third thickness.

10. The electronic device defined in claim 1, wherein the second planarization layer has an upper surface, wherein the upper surface has a maximum slope, and wherein the maximum slope is less than 3 microns of drop per 1 millimeter of lateral extension.

11. The electronic device defined in claim 1, further comprising:
a transparent cover layer formed over the polarizer, wherein the second planarization layer has an upper surface that is separated from a lower surface of the transparent cover layer by a distance and wherein the distance varies by less than 5 microns across the display.

12. The electronic device defined in claim 1, further comprising:
a transparent cover layer formed over the polarizer, wherein the polarizer has an upper surface that is separated from a lower surface of the transparent cover layer by a distance and wherein the distance varies by less than 5 microns across the display.

13. An electronic device, comprising:
a substrate with a physical hole;
an array of organic light-emitting diode display pixels arranged on the substrate, wherein the organic light-emitting diode display pixels include organic light-emitting diode layers;
a first passivation layer that is formed over the array of organic light-emitting diode display pixels;
a first planarization layer that is formed over the first passivation layer;
a second passivation layer that is formed over the first passivation layer and that contacts the first passivation layer between the array and an edge of the physical hole;
a cutting structure between the array and the edge of the physical hole, wherein the cutting structure creates a discontinuity in the organic light-emitting diode layers and wherein the first and second passivation layers overlap the cutting structure; and
a metal layer portion that overlaps the cutting structure, wherein the first and second passivation layers are interposed between the metal layer portion and the cutting structure, wherein the metal layer portion has a first width, and wherein the cutting structure has a second width that is less than the first width.

14. The electronic device defined in claim 13, wherein the metal layer portion is part of a metal layer and wherein the metal layer includes additional metal layer portions that form touch-sensor metal over the array of organic light-emitting diode pixels.

15. The electronic device defined in claim 13, wherein the cutting structure has an undercut.

16. An electronic device with a display, the electronic device comprising:
a substrate;
an array of display pixels arranged on the substrate in a light-emitting area of the display;
a first passivation layer that is formed over the array of display pixels;
a first planarization layer that is formed over the first passivation layer;
a second passivation layer that is formed over the first planarization layer;
a second planarization layer that is formed over the second passivation layer; and
a polarizer that is formed over the second planarization layer, wherein the second planarization layer has a first portion that overlaps the light-emitting area and a second portion that overlaps a non-light-emitting area of the display, wherein the first portion of the second planarization layer has a first thickness, wherein the second portion of the second planarization layer has a second thickness that is greater than the first thickness, wherein the first thickness is between 5 microns and 15 microns, and wherein the second thickness is between 20 microns and 30 microns.

* * * * *